United States Patent [19]

Berrou et al.

[11] Patent Number: 5,406,570
[45] Date of Patent: Apr. 11, 1995

[54] METHOD FOR A MAXIMUM LIKELIHOOD DECODING OF A CONVOLUTIONAL CODE WITH DECISION WEIGHTING, AND CORRESPONDING DECODER

[75] Inventors: Claude Berrou, le Conquet; Patrick Adde, Brest, both of France

[73] Assignee: France Telecom and Telediffusion de France, France

[21] Appl. No.: 870,483

[22] Filed: Apr. 16, 1992

[30] Foreign Application Priority Data

Apr. 23, 1991 [FR] France ................. 91 05279

[51] Int. Cl.⁶ ............................................. H01S 3/18
[52] U.S. Cl. ........................................ 371/43; 371/44;
  375/94; 375/341
[58] Field of Search ................. 371/43, 44, 45, 37.1,
  371/46; 375/94, 75

[56] References Cited

U.S. PATENT DOCUMENTS

| | | | |
|---|---|---|---|
| 4,777,636 | 10/1988 | Yamashita et al. | 371/43 |
| 4,811,346 | 3/1989 | Battail | 371/43 |
| 4,823,346 | 4/1989 | Kobayashi et al. | 371/43 |
| 4,868,830 | 9/1989 | Pollara-Bozzola | 371/43 |
| 5,214,675 | 5/1993 | Mueller et al. | 375/94 |

OTHER PUBLICATIONS

Gerhard Fettweis "Cascaded Feedforward Architectures For Parallel Viterbi Decoding" pp. 978–981 IEEE 1990.
Hornj Bar et al. 'Algorithms and Architectures For Concurrent Viterbi Decoding' pp. 836–840 IEEE 1989.
Tajima, et al., "SST Viterbi Decoder Branch Metric Computation Based on MAP Estimation Method", The Transactions of the Insitute of Electronics, Information and Comm. Engineers E72 (1989) May, No. 5, Tokyo, JP.
Viterbi, "Error Bounds for Convolutional Codes and an Asymptotically Optimum Decoding Algorithm", IEEE Transactions on Information Theory, vol. IT-13 No. 12, Apr. 1967, pp. 260–269.
Forney, Jr., "The Viterbi Algorithm", Proceedings of the IEEE, vol. 61, No. 3, Mar. 1973, pp. 268–278.
Battail, et al., "Decodage par Repliques", Ann. Telecommuniq. 31, No. 11–12, 1976.

Primary Examiner—Robert W. Beausoliel, Jr.
Assistant Examiner—Albert Decady
Attorney, Agent, or Firm—Locke Reynolds

[57] ABSTRACT

A method for the decoding of digital data obtained according to a convolutional coding and transmitted on a noise-ridden channel aimed at improving the methods of maximum likelihood decoding such as the Viterbi algorithm consisting in associating, with each estimation s(t) of the corresponding source digital element a(t), a weighting coefficient m(t) representing the reliability of the estimation s(t), the estimation s(t) taking account of the values of a first series of L received samples, and the weighting m(t) taking account of the values of a second series of N samples received, N being strictly greater than L. In a preferred embodiment, a second trellis is associated with the standard first decoding trellis, a trace-back being done in the second trellis on two concurrent paths, used to revise the weighting coefficients obtained at output of the first trellis.

13 Claims, 6 Drawing Sheets

METHOD FOR A MAXIMUM LIKELIHOOD DECODING OF A CONVOLUTIONAL CODE WITH DECISION WEIGHTING, AND CORRESPONDING DECODER

BACKGROUND OF THE INVENTION

1. Field of the Invention

The field of the invention is that of the decoding of digital data received in a decoder and, notably, of data transmitted in the presence of transmission noise.

More specifically, the invention relates to the decoding of data obtained by convolutional coding. In a known way, convolutional codes associate, with a source data element to be transmitted, at least one coded value obtained by the linear combination of this source data element with at least one of the preceding source data elements.

In a standard way, such codes are decoded by means of a maximum likelihood algorithm of the Viterbi algorithm type. This algorithm gives a binary estimation of each symbol coded at transmission. Thus, depending on the success of the decoding, this estimation proves to be either wholly correct or wholly false.

2. Description of the Prior Art

It has been seen that it is especially useful to weight the decisions taken by a maximum likelihood decision algorithm, notably when the convolutional code is concatenated with one or more other codes such as, for example, another code of a convolutional type. Indeed, this then enables the decoder of this concatenated code to be informed of the reliability of the estimation transmitted to it.

A weighted decision decoder then delivers an information element coded on n bits at output, the most significant bit being identical to that delivered by the standard decoder, and the remaining n-1 bits representing the reliability assigned to the decision.

It is known that the Viterbi algorithm, which shall be described in greater detail here below, is based on the determination of an optimal path in a trellis, by the systematic elimination of one path among two possible paths reaching each node of the trellis. For each node, therefore, two transition metrics are determined, these transition metrics representing the distance between the transition that is possible on each path and the value actually received by the decoder. These transition metrics enable the computation of the cumulated metrics, representing the cumulated noise on the path considered. A cumulated metric is thus an integral of the transition metrics. According to Viterbi's algorithm, only the path corresponding to the smallest cumulated metric is kept.

It can be clearly seen that the systematic elimination of a path introduces a risk of error, notably when the two computed metrics are close. By contrast, when one of the metrics is small and the other is great, the probability of estimation error is low. The first idea implemented to weight the Viterbi algorithm was therefore the association, with each node, of a weighting coefficient equal to the difference (in terms of absolute value) between the two cumulated metrics.

This mode of weighting, which is particularly simple, is not optimal in terms of results.

There also exists an improved decoding method known from the US patent document U.S. Pat. No. 4,811,346, granted on 07-03-1989. This is an improved decoding method with weighting of the symbols decoded by the Viterbi algorithm. According to this method, the weighting coefficient associated with a decision is revised periodically in taking account of the samples received subsequently.

This method gives results that are far more satisfactory than with the basic principle. By contrast, it proves to be extremely complex to implement. Indeed, it calls for the permanent memorizing of the two paths associated with each node as well as a large number of computations at each instant of reception. In practice, this method cannot be implanted in an integrated circuit for purposes of low-cost, industrial-scale distribution.

The invention is aimed notably at overcoming these different drawbacks of the prior art.

SUMMARY OF THE INVENTION

More precisely, the invention is aimed at providing a method for the maximum likelihood decoding of a convolutional code with weighting of decisions, the results of which are almost optimal, and especially superior to those of already known methods or at least equivalent for a lower level of complexity. An essential aim of the invention is therefore, in other words, to provide for a method such as this providing for an almost Gaussian statistical distribution of the weighting.

The invention is also aimed at providing a method such as this restricting the complexity of implementation, as regards both the storage means and the processing means necessary. It is thus a particular aim of the invention to provide a decoding method such as this that can be easily implanted on silicon and can therefore be made on an industrial scale at low cost.

Another aim of the invention is to provide a method of this type that is compatible with all the types of convolutional codes, binary or more generally n-ary codes, whatever may be their efficiency rate (equal to 1/R with R as a whole number greater than 1) and their constraint length, whether they are punctured or not.

In the same way, an object of the invention is to provide on a method such as this that can be implemented jointly with one or more concatenated decoders.

Another aim of the invention is to provide a decoder using a decoding method such as this.

These methods, as well as others that shall appear hereinafter, are achieved according to the invention by means of a method for the maximum likelihood decoding of a sequence of received samples $R(t)$ corresponding to the convolutional coding of source digital elements $a(t)$, of the type associating, with each of the received samples $R(t)$, an estimation $s(t)$ of the corresponding source digital element $a(t)$ and a weighting coefficient $m(t)$ representing the reliability of said estimation $s(t)$, wherein said estimation $s(t)$ takes account of the values of a first series of L received samples, comprising said received sample $R(t)$ corresponding to said source digital element $a(t)$ and the following $L-1$ received samples $R(t+1), \ldots, R(t+L-1)$, L being strictly greater than 1, and wherein said weighting $re(t)$ takes account of the values of a second series of N received samples, comprising said received sample $R(t)$ corresponding to said source digital element $a(t)$ and the following $N-1$ received samples $R(t+1), \ldots, R(t+L-1), \ldots R(t+N-1)$, N being strictly greater than L.

It indeed proves to be the case that it is particularly effective, after the estimation of a value has been decided upon, to further follow the progress of the samples received to assign it a coefficient of ponderation.

In the case of a decoding method of the type comprising a step for the estimation of a value s(t) of each of said source digital elements a(t), taking account, for the estimation of a source digital value s(t), of the values of a series of received samples, comprising the received sample R(t) corresponding to said source digital element a(t) and to at least one of the following received samples R(t+1), . . . R(t+L−1), and a step for the weighting of the estimation s(t) consisting in the association, with each of said estimations s(t), of a weighting coefficient m(t) representing the reliability of said estimation, this method advantageously also comprises a step for the revision of said weighting coefficient consisting of the revision, at each instant of reception t, of each of the weighting coefficients m(t−N) to m(t−L−1), corresponding to the N−L last values estimated s(t−N) to s(t−L−1) as a function of the received sample R(t).

The invention also notably relates to a method of the type that consists in deciding, by means of a decision algorithm of the Viterbi algorithm type, of an estimation s(t) of the value of each of said source digital elements a(t), said decision algorithm defining a first trellis T(2$^\nu$,L) of the possible states of the coding, comprising a set of nodes, organized in N columns or depth levels, of 2$^\nu$; nodes, L being the number of received samples R(t−L−1), . . . ,R(t) taken into account for the estimation s(t) of the value of one of said source digital elements a(t), and 2$^\nu$ being the number of possible states of the convolutional code at a given instant, $\nu$ being the constraint length of the code used, each of said nodes of a given level of depth i corresponding to a given instant of reception and being connected to two nodes of the preceding level of depth i−1, corresponding to the preceding instant of reception, by means of two paths, each path corresponding to a possible transition according to said convolutional code, said estimation step consisting in:

determining, for each node of said first trellis, the most probable path, or survivor path, ending at said node and in eliminating, from said first trellis, the path concurrent with said survivor path, the survivor path being the one having the smallest cumulated distance, or metric distance, M$^0$ or M$^1$;

tracing back the optimal path in said first trellis, in starting from the node having the smallest cumulated metric on the first level of depth, corresponding to the last received sample R(t), and in following, at each level, the survivor path associated with the node reached;

associating, with the estimation s(t−L) corresponding to the decoding of the received sample R(t−L), the value of the terminal node of said optimal path, and said weighting step consisting in the association, with said estimation s(t−L), of a weighting coefficient m(t−L), representing the reliability of said estimation s(t−L), said weighting coefficient being obtained by analysis of the cumulated metrics M$^0$ and M$^1$ associated with each of the nodes of said optimal path, wherein said method comprises a step for the revision of said weighting coefficients consisting, at each instant of reception t, in:

memorizing the weighting coefficient m(t−L) associated with said estimation s(t−L);

defining a second trellis T'(2$^\nu$,L') of the possible states of the coding, where L'=N−L, consecutive to said first trellis T(2$^\nu$, L) corresponding to the instants of reception between t−L−1 and t−L−L';

tracing back, in said second trellis, the two concurrent paths corresponding to the two paths coming from said terminal node of the optimal path of the first trellis;

revising the values of each of the weighting coefficients m(t−L−1) to m(t−N) associated respectively with each of the estimations s(t−L−1) to s(t−N) of the values of the digital samples received between the instants t−L−1 and t−N as a function of a level-to-level comparison of the values s$_k$ and s'$_k$ corresponding to these digital samples received, on the two concurrent paths.

In a preferred embodiment of the invention, said coefficient m(t−L) determined during said weighting step is equal to the absolute value $\Delta M_{t-L}$ of the difference between the two metrics M$^0_{t-L}$ and M$^1_{t-L}$ associated with said terminal node of said optimal path, also called a concurrence index, said metrics M$^0_{t-L}$ and M$^1_{t-L}$ being the total of the distances L$^0$ and L$^1$ computed for each node of said optimal path, said distances representing the difference between the received symbol and the symbols corresponding to the two transitions possible in order to reach this node.

Indeed, the absolute value of the difference between these two metrics directly represents the confidence that may be placed in an estimation. If the two metrics are close to each other, the decision may be unreliable. On the contrary, if one of the metrics is high and the other is low, then it is probable that the symbol received corresponds effectively to the small metric.

Advantageously, at each reception instant t and for each of the levels k of said second trellis, said revision step carries out a comparison of the values s$_k$ and s'$_k$ corresponding to the received sample R(t−L−k) on each of the two concurrent paths, said index of concurrence m$_k$ being revised downwards if these values s$_k$ and s'$_k$ are different.

It is in fact important that the confidence placed in a given estimation should not be greater than the confidence placed in the choice of the path enabling this result to be achieved.

In one particular embodiment of the invention, when said values s$_k$ and s'$_k$ corresponding to the sample received R(t−L−k) on each of the two concurrent paths are different, then said index of concurrence m$_k$ is taken to be equal to the smallest of the values m$_k$ and m$_L$, m$_L$ being the index of concurrence associated with the estimation s(t−L), the starting point of said concurrent paths, determined during said weighting step.

Advantageously, a provisional weighting coefficient $\Delta M$ is associated with each of said nodes of said first trellis, each of said weighting coefficients $\Delta M$ being updated at each instant of reception t as a function of the received sample R(t).

In another variant of the invention, said index of concurrence m$_L$ is recomputed, at each instant of reception t, as a function of the memorized received samples R(t−L) to R(t).

Preferably, said revision step comprises a step for the logarithmic compression of said index of concurrence m$_{t-L}$, before it is memorized.

This characteristic, which is aimed at obtaining an improved sampling of the critical values with respect to the decision, makes it possible to obtain a major reduction in the rates of error.

In an advantageous embodiment, the depth L' of said second trellis is substantially equal to half the depth L of said first trellis.

For, the length L' should not be too great. If not, problems of untimely downward revision occur when two concurrent paths are false.

The received samples R(t) may notably be of the type comprising, at least at certain instants t, two distinct coded data elements X(t) and Y(t) corresponding to said source digital element a(t).

In particular, the data elements may be those produced by systematic, separable, standard convolutional codes, or those described in the already-mentioned joint patent application.

The invention also relates to a decoder implementing the above-described method, and notably to a decoder of a sequence of received samples R(t) corresponding to a convolutional coding of a sequence of source digital elements a(t), comprising:

means for the memorization of said first and second trellises, behaving like level-by-level shift registers;

means for the tracing back of said optimal path, in said first trellis, and means for the tracing back of the two concurrent paths in said second trellis;

means for the memorizing of all of said concurrence indices associated with each of the nodes of said first trellis, with a size $L \times 2^\nu \times \mu$, where $\mu$ is the number of bits used for the coding of a concurrence index;

a shift register, for the memorizing of the weighting coefficients $m(t-L-1)$ to $m(t-N)$;

means for the revision of said weighting coefficients, as a function of the two concurrent paths traced back to said second trellis.

In another embodiment, the means for memorizing the set of said concurrence indices associated with each of the nodes of said first trellis may be replaced by means for the memorizing of all the samples received $R(t-L)$ to $T(t)$, with a size $L \times n$, n being the number of bits used for the coding of the value of a received sample.

Advantageously, said shift register for the memorizing of the weighting coefficients is supplied by the concurrence index $m_{t-L}$ of said final node of said optimal path, converted according to a logarithmic relationship.

BRIEF DESCRIPTION OF THE DRAWINGS

Other features and advantages shall appear from the description of a preferred embodiment of the invention, given by way of a non-restrictive illustration, and from the appended drawings, of which.

MORE DETAILED DESCRIPTION

Figure 1:
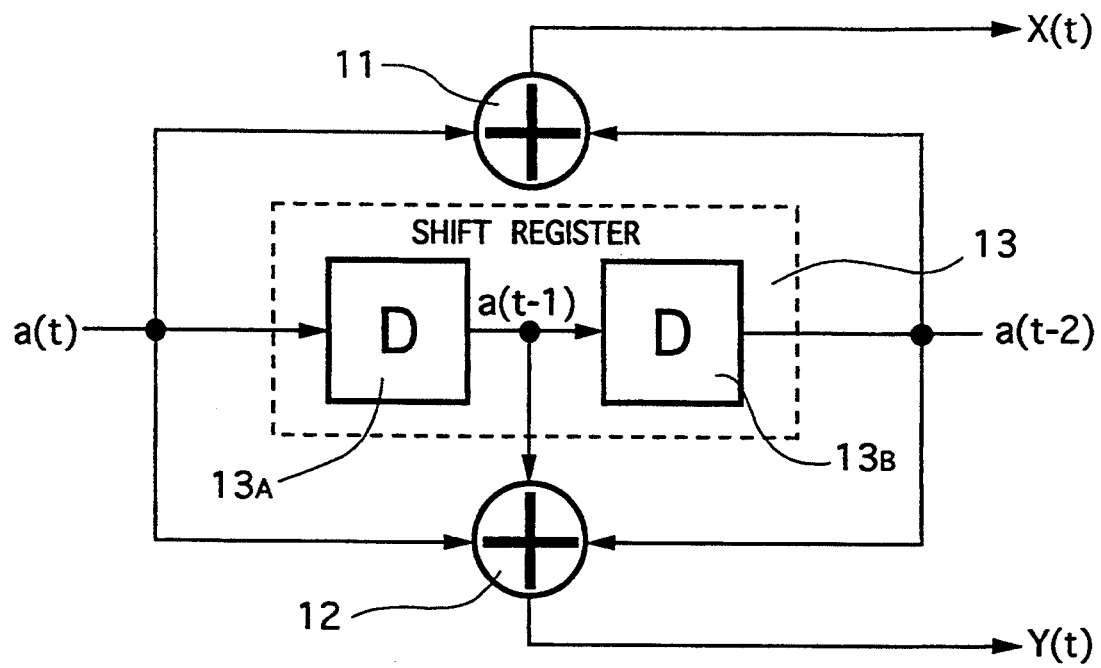
FIG. 1 is a diagram of a convolutional coder in the embodiment described, corresponding to the so-called "standard" code, having a constraint length $\nu$ equal to 2 and an efficiency rate of ½.

The working of the method of the invention is described here below in detail in the case of a standard convolutional code, with a constraint length $\nu = 2$ and efficiency rate ½, obtained by means of an coder as shown in FIG. 1. However, it is clear that the decoding method may be applied to all the convolutional codes having efficiency rate $\eta = 1/R$ (R is an integer >1), whatever they may be, by simple generalization of the described method.

FIG. 1 therefore shows a standard coder which associates two distinct coded values X(t) and Y(t) with each source data element a(t), said values being obtained by the sums modulo 2 (exclusive-OR) 11 and 12 of this source data element a(t) with at least one of the preceding source data elements $a(t-1)$, $a(t-2)$ memorized in the cells $13_A$, $13_B$ of a shift register 13.

Figure 2:
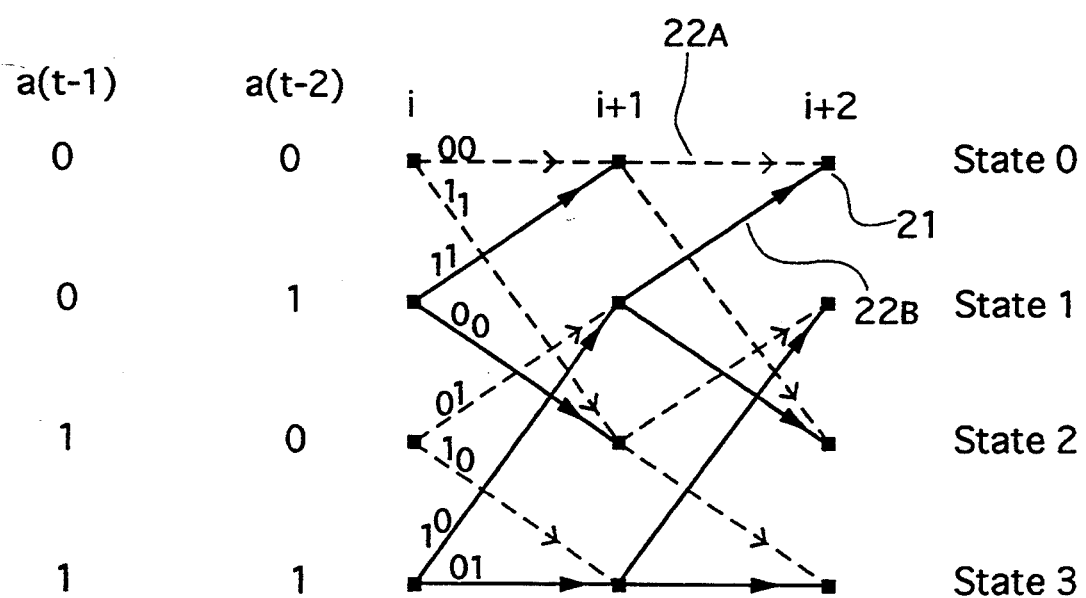
FIG. 2 shows a trellis of the states of the coding, representing the coder of FIG. 1.

The working of this coder may be described by the diagram of the trellis shown in FIG. 2. This presentation has been proposed by G. D. Forney in the article "The Viterbi Algorithm" (Proc. IEEE, March 1973, 61, No. 3, pp. 268–278).

The Viterbi algorithm is a decoding technique that can be used to find the maximum likelihood path in the trellis. This is the most probable path with respect to the one described at transmission by the coder.

Each node 21 of the trellis used during the decoding contains an information element on the survivor path of the paths $22_A$ and $22_B$ ending at the node 21. The basic principle of the Viterbi algorithm consists indeed in considering, at each node, only the most probable path so as to enable easy trace-back operations on the trellis and hence to determine an a posteriori estimation of the value received several reception instants earlier.

Figure 3:
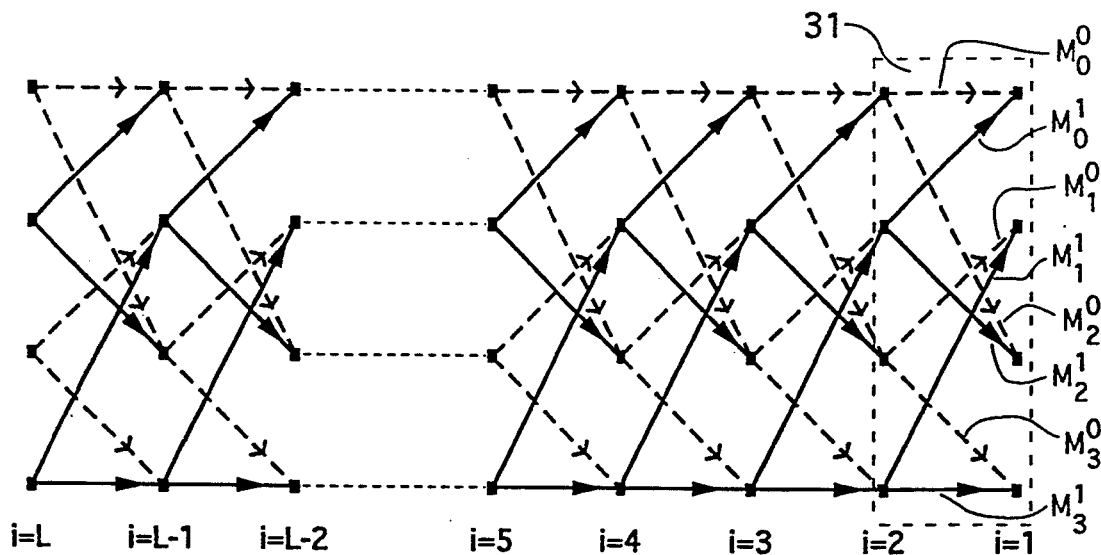
FIG. 3 shows a decoding trellis, implemented in a Viterbi algorithm, with a horizontal dimension, or depth L, and with a vertical dimension $2^\nu$.

The trellis used for the decoding, referenced $T(2^\nu, L)$ is shown in FIG. 3. It has a "vertical" dimension equal to the number of possible states of the coder, namely $2^\nu$, $\nu$ being the constraint length of the code, i.e. the number of memory elements used during the coding, and a "horizontal" dimension called depth, referenced L. In the present case, $2^\nu$ is equal to 4.

Furthermore, it is clear that the algorithm is all the more efficient as L is great, since L corresponds to the number of received samples taken into account for the decoding of a given sample.

The Viterbi algorithm is notably described in the article by A. J. Viterbi, "Error Bounds For Convolutional Codes And An Asymptotically Optimum Decoding Algorithm" (IEEE Trans. IT, USA, November 1967, 13, No. 6, pp. 260–269). The operations performed in this algorithm in a clock period T are recalled herein with reference to the example of the standard code.

1/A computation is made of the distances, also called transition metrics or branch metrics, between the received symbols and the symbols corresponding to the eight possible transitions 31, namely:

$$L^0{}_j = |X' - X^0{}_j| + |Y' - Y^0{}_j|$$

$$L^1{}_j = |X' - X^1{}_j| + |Y' - Y^1{}_j|$$

for j varying from 0 to 3, and where:
(X',Y') represents the pair effectively received and sampled on n bits;
$X^0{}_j$ (and $Y^0{}_j$ respectively) represent the value X (and Y respectively) considered on the transition ending at the state j and corresponding to a value a(t−2) leaving the register of the coder equal to 0 (corresponding to the links in dashes shown in FIG. 3);
$X^1{}_j$ (and $Y^1{}_j$ respectively) represent the value X (and Y respectively) considered on the transition ending at the state j and corresponding to a value a(t−2) leaving the register of the coder equal to 1 (corresponding to the solid line links shown in FIG. 3);
Generally, $2^{\nu+1}$ transitions are thus computed.

2/With each state j, there is associated an adder-accumulator containing the cumulated metric $M_j$ such that:

$$M^0{}_0(t) = M_0(t-1) + L^0{}_0(t-1); M^1{}_0(t) = M_1(t-1) + L^1{}_0(t-1)$$

$$M^0{}_1(t) = M_2(t-1) + L^0{}_1(t-1); M^1{}_1(t) = M_3(t-1) + L^1{}_1(t-1)$$

$$M^0{}_2(t) = M_0(t-1) + L^0{}_2(t-1); M^1{}_2(t) = M_1(t-1) + L^1{}_2(t-1)$$

$$M^0{}_3(t) = M_2(t-1) + L^0{}_3(t-1); M^1{}_3(t) = M_3(t-1) + L^1{}_3(t-1)$$

$$M_j(t) = \min(M^0{}_j(t); M^1{}_j(t))$$

3/With each state j, there is associated a memory cell, for example a D flip-flop, and the entire trellis constitutes a dimension register (4, L). In FIG. 3, the shift takes place from right to left. At the first level (i=1), the content $s_j$ of the flip-flop associated with the state j is placed at 0 if $M^0{}_j(t) \leq M^1{}_j(t)$, and placed at 1 if $M^0{}_j(t) > M^1{}_j(t)$. $s_j$ therefore directly represents the sign of $M^0{}_j(t) - M^1{}_j(t)$;

4/A trace-back is done on the path memorized in the trellis from i=1 to i=L, starting from a state provided with a cumulated metric $M_j$ that is the smallest among four and using, at each level of this trace-back, the contents of the flip-flop reached to choose between the two possible transitions. The decoded bit then comes from the flip-flop at the level i=L, at the end of the path that has been traced back. Thus, at the instant t, the: bit a(t−L) is decoded.

5/A complete shift of the trellis is made, and the operation is recommenced at the next clock period.

Figure 5:
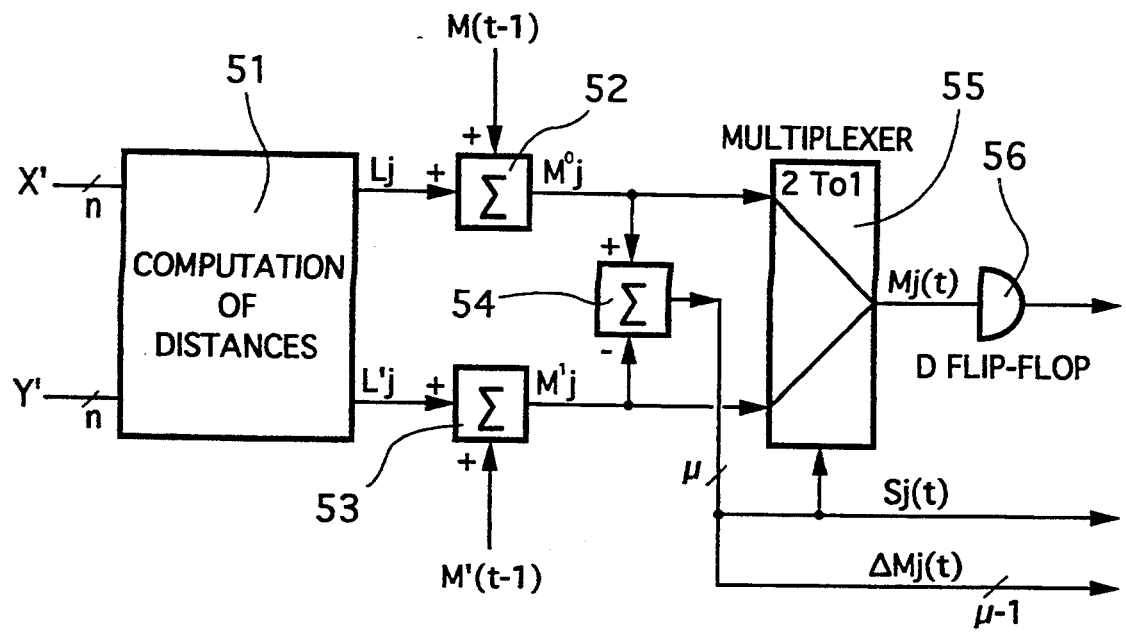
FIG. 5 is a block diagram of an example of a module for the computation of the metrics and of the associated survivor paths, according to a known method.

By way of an example, a description is given here below of an embodiment of a module for the computation of the metrics and of the associated survivor paths, such as they may be implemented in a decoder, in relation with FIG. 5.

The received data elements, X' and Y', sampled on n bits, are introduced into a module 51 for the computation of the distances, according to the principle described here above (step 1) producing the values $L^0{}_j$ and $L^1{}_j$.

Two summators 52 and 53 determine the cumulated metrics:

$$M^0{}_j = M(t-1) + L^0{}_j$$

$$M^1{}_j = M'(t-1) + L^1{}_j$$

The values M(t−1) and M'(t−1) are not indexed. They depend on the trellis used, and hence on the code used. For example, if the coding trellis of FIG. 2 is considered, these two values are obtained in the manner described in the step 2 above.

A subtractor 54 then determines the difference between the two cumulated metrics $M^0{}_j$ and $M^1{}_j$, coded on μ bits. This difference may be split up between the sign $s_j(t)$ of the difference and the absolute value $\Delta M_j(t)$ of this difference which corresponds to a weighting of the decision on the line.

The sign $s_j(t)$ designates the smallest cumulated metric. It therefore controls a 2 to 1 multiplexer 55, which directs the concerned metric $M_j(t)$ towards the flip-flops 56.

Figure 4:
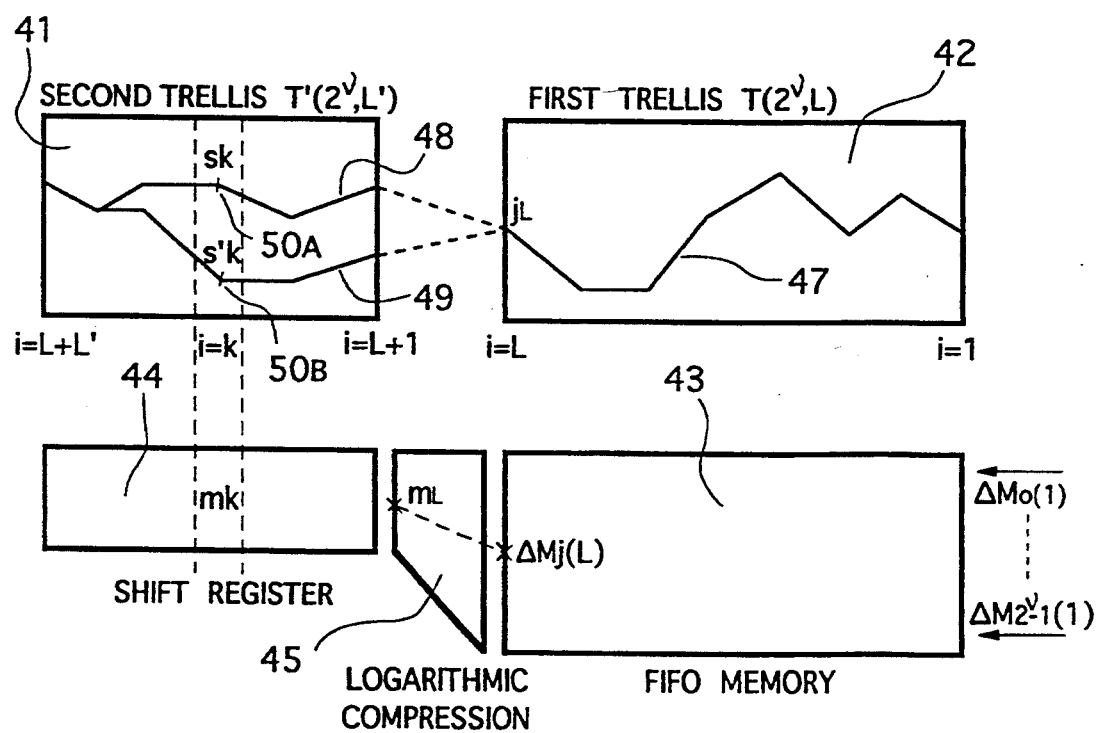
FIG. 4 shows a complete structure of a decoder implementing the method of the invention, comprising notably a first and a second trellis.

According to the invention, a weighting coefficient is associated with each of the decoded bits and then revised at least once. To this end, in the embodiment described, and as shown in FIG. 4, the first trellis $T(2^\nu, L)$ 42 is complemented on its left, i.e. after the level i=L, by a second trellis $T'(2^\nu, L')$ 41.

In parallel with the first trellis 42, there is deposited a FIFO (first in - first out) type memory 43 having a size $L \times 2^\nu \times \nu$. This memory 43 is supplied, at each clock period, by the $2^\nu$ quantities $$\Delta M_j(t) = |M^0{}_j(t) - M^1{}_j(t)|$$

for j varying from 0 to $2^\nu - 1$, $\Delta M_j(t)$ being coded on μ bits.

$\Delta M_j(t)$ shall hereinafter be called the "index of concurrence", "measurement of concurrence", or "concurrence".

In parallel with the second trellis 41, there is positioned a shift register 44, with a size $L' \times (n-1)$. This register 44 is supplied by the concurrence coming from the FIFO memory 43 at the level i=L, at the address corresponding to the state $J_L$ at which the trace-back of the optimal path 47 of the first trellis 42 has ended.

Advantageously, this concurrence is modified before being memorized in the register 44 according to the relationship of logarithmic compression 45, having the form $\log(1+x/\Theta)$. Very good results are notably achieved with $\Theta = 1/d$, where d is the free distance of the code.

Let $m_L$ be this concurrence modified by the logarithmic compression 45 and $m_k$ the contents of the register at the level k (k>L), $m_L$ and $m_k$ being coded on n−1 bits. Let also $s_L$ be the binary value contained in the flip-flop having the address i=L, j=$j_L'$. $s_L$ is the sign associated with $m_L$.

The essential characteristic of the invention lies in the continuing (48 on the second trellis 41) of the trace-back 47 of the maximum likelihood path of the first trellis 42 and in the trace-back, also in the second trellis 41, of the concurrent path 49 of the maximum likelihood path 49. This concurrent path 48 is the other path leaving the state $j_L$, namely the path given by the sign $\bar{s}_L$. Let $s_k$ and $s'_k$ be the contents of the two flip-flops $50_A$ and $50_B$, at the level k, of the two paths thus traced back simultaneously.

An operation to revise the contents of the register 44 is then performed, in the following form, for any level k:

if $s_k \neq s'_k$ and if $m_k > m_L$ then $m_k = m_L$

The final result of the decoding is given, after a latency L+L' in the following form:
for the sign (estimated binary value), by $s_{L+L'}$;
for the weight, or weighting coefficient, by $m_{L+L'}$ The depth L' of the second trellis is chosen so as to obtain the most efficient results. It is thus seen that the ideal length L' is of the order of L/2, L being the depth of the first trellis 42. It is observed notably that, when L' is higher, the results deteriorate, especially because of untimely revisions when the two concurrent paths 48 and 49 are false.

We shall now present an exemplary implementation of the method just described in a decoder.

Figure 6:
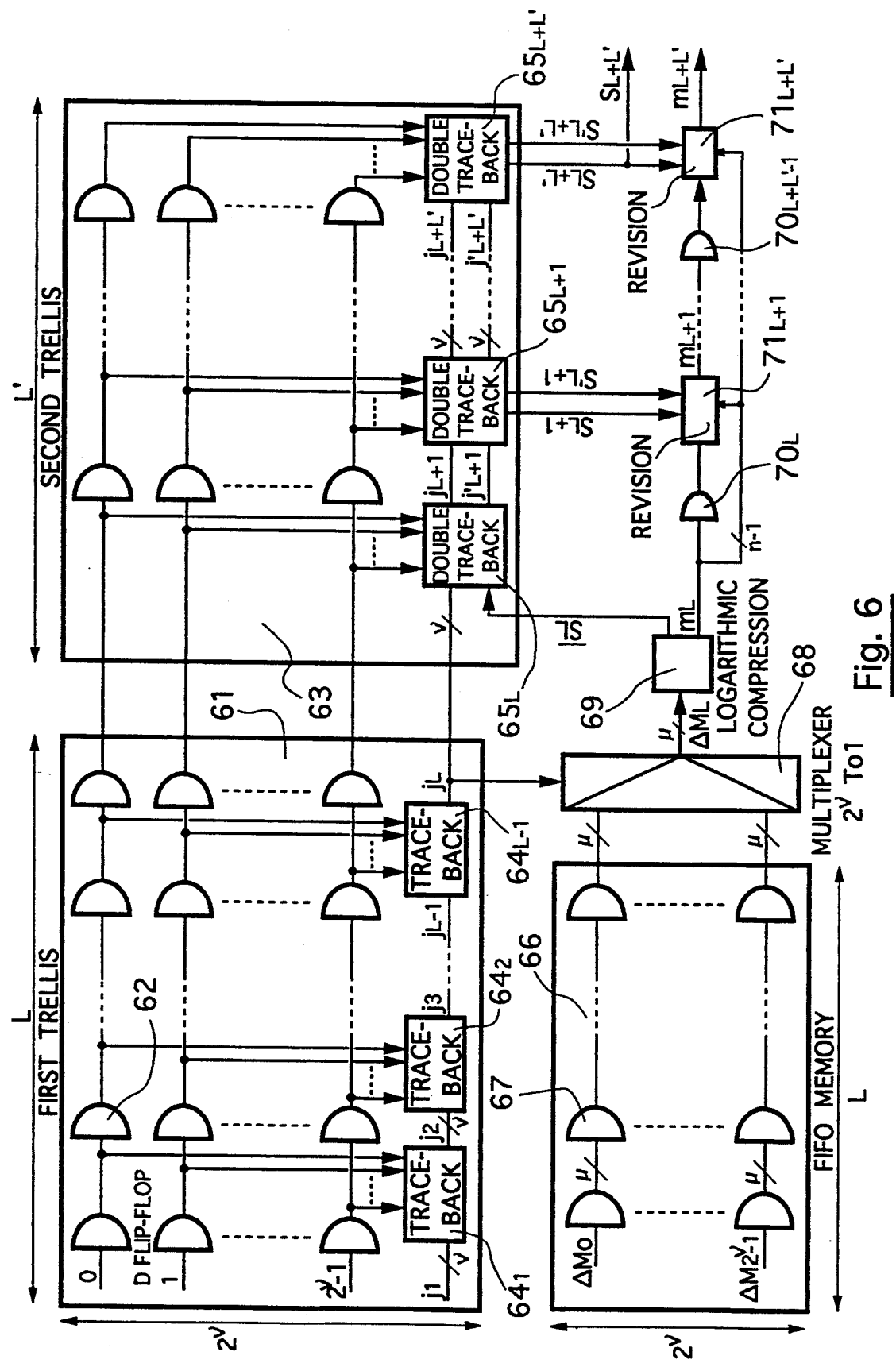
FIG. 6 is a block diagram of a particular exemplary embodiment of a decoder as shown in FIG. 4.

FIG. 6 is a block diagram of such a decoder. It has a first trellis 61, constituted by $L \times 2^\nu$ D flip-flops 62 placed in $2^\nu$ lines of L cascaded flip-flops. This first trellis is extended directly by a second similar trellis 63, with a depth L'.

To each level of depth (column) of the trellis, there corresponds a traceback module $64_1$ to $64_{L-1}$, determining the optimal path. The working of this module 64 is specified further below, with reference to FIG. 7.

Similarly, a double trace-back module $65_L$ to $65_{L+L'}$ is associated with each level of the second trellis 63. The double trace-back modules determine the two concurrent paths used to revise the weighting coefficients $m_L$ to $m_{L+L'}$. These double trace-back modules 65 are constituted by two single trace-back modules, of the kind described with reference to FIG. 7, placed in parallel.

In parallel to the trellis 61, the decoder comprises a FIFO memory 66, each flip-flop 67 of which memorizes the concurrence ΔM corresponding to each node of the trellis 61, coded on μ bits.

The memory 66 is connected to a $2^\nu$ to 1 multiplexer 68, controlled by the value $j_L$ coming from the last trace-back module $64_{L-1}$ which designates the end of the optimal path. This multiplexer 68 therefore delivers the value of the cumulated metric $\Delta M_L$ which is converted by a logarithmic compression module 69.

The logarithmic compression module 69 gives, firstly, the value $s_L$ opposite the sign of $M^0(t) - M^1(t)$, which indicates the origin of the path concurrent with the optimal path and is transmitted to the first double trace-back module $65_L$ and, secondly, a weighting coefficient or concurrence index $m_L$.

This logarithmic compression module 69 is aimed at placing emphasis, in terms of sampling quality, on the most critical values, namely for example, if $m_L$ is coded between −7 and +7, on the values close to 0. This enables the error rate to be divided by about two.

According to the invention, the concurrence indices $m_L$ to $m_{L+L'}$ are revised at each instant of reception. To this end, the indices are stored in flip-flops $70_L$ to $70_{L+L'-1}$. Between each of these flip-flops, there is interposed a module $71_{L+1}$ to $71_{L+L'}$ for the revision of the concurrence, which makes a level-to-level comparison of the values $s_k$ and $s'_k$ present on the two concurrent paths, given by the double trace-back modules. This revision module 71 is described in greater detail with reference to FIG. 8.

At each reception instant, the decoder therefore finally gives the definitive values $s_{L+L'}$ and $m_{L+L'}$.

Figure 7:
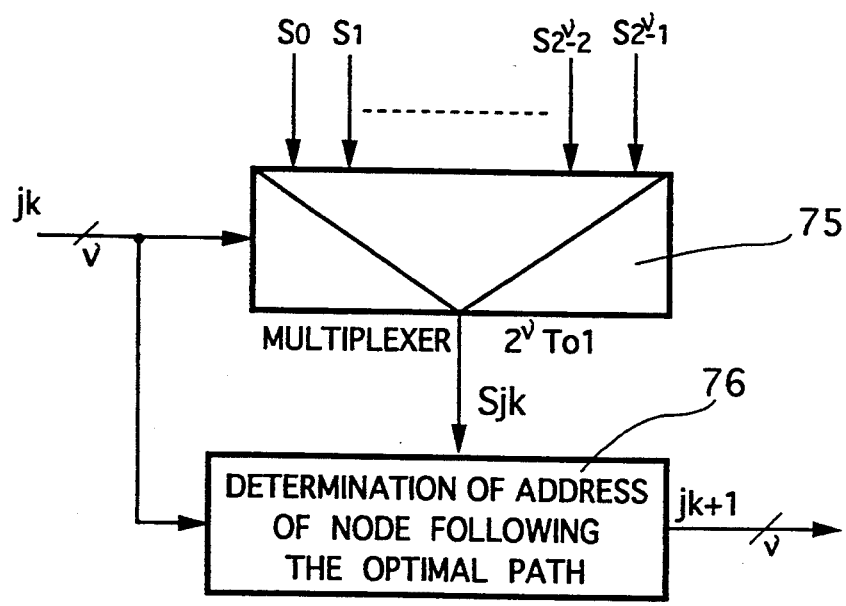
FIG. 7 shows a detailed block diagram of the module for the trace-back of the optimal path of the decoder of FIG. 6.

FIG. 7 is the schematic diagram of a trace-back module 64. This module has a $2^\nu$ to 1 module 75, fed by the $2^\nu$ survivors $s_j$ at the level k. The multiplexer 75 is controlled by the value $j_k$ coming from the preceding trace-back module and designates the survivor to be considered on the optimal path at the level k+1. It transmits this information element $s_{jk}$ to the module 76. This information element $s_{jk}$, when combined with $j_k$, gives the address $j_{k+1}$ of the node of the following level of the optimal path.

Figure 8:
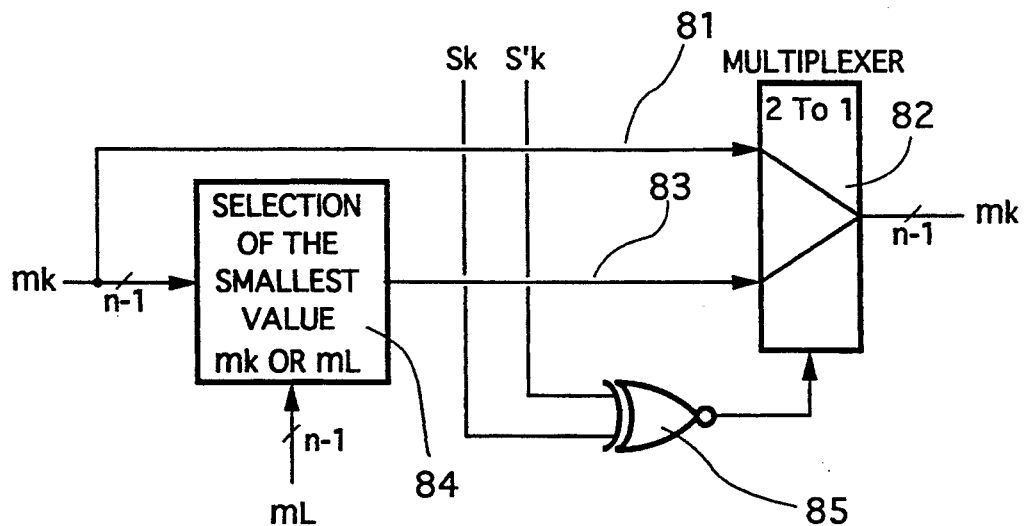
FIG. 8 shows a detailed block diagram of the module for the revision of the concurrence of the decoder of FIG. 6.

A revision module 71 is shown in FIG. 8. At the level k, the index of concurrence $m_k$, coded on n−1 bits is one of the inputs 81 of a 2 to 1 multiplexer 82. The other input 83 of this multiplexer is given by a module 84 which gives the smallest of the $m_k$ and $m_L$, $m_L$ being the index of concurrence coming from the logarithmic compression module 69 (FIG. 5).

The multiplexer 82 is controlled by the output of an OR-exclusive gate 85 which compares the values $s_k$ and $s'_k$ of the two concurrent paths at the level k. If these values are identical, the value $m_k$ is kept. If not, then $m_k$ is replaced by the smallest of the values $m_k$ and $m_L$.

Figure 9:
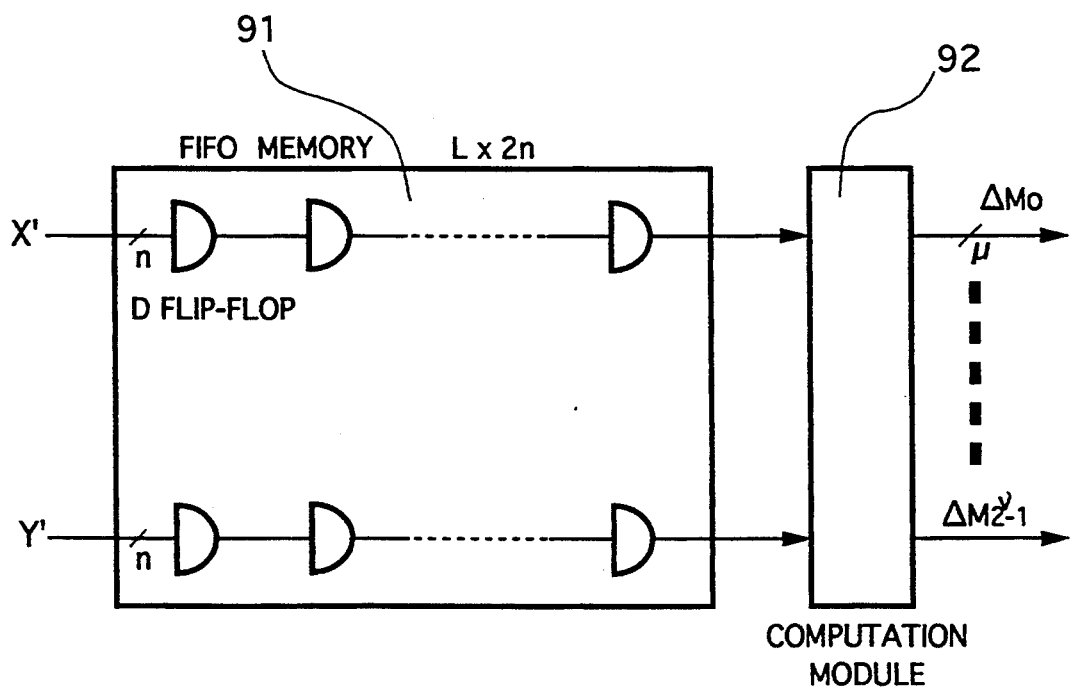
FIG. 9 shows a variant of the computation of the weighting coefficients, in relation to the means implemented in the decoder of FIG. 6.

$m_L$ can also be obtained in the following manner, which is more favorable, as regards the space occupied by the circuit, for big constraint lengths. Referring to FIG. 6, the FIFO memory 66 containing the indices of concurrence is replaced by another memory shown in FIG. 9. This memory 91, also of the FIFO type, has a size of L×2n, to "convey" the received quantities up to the level i=L.

It is then possible, at the end of the first trellis, to recompute the cumulated metrics and the modified concurrence $m_L$, in a computation module 92. This variance prevents the computation of the $2^\nu - 1$ indices of concurrence which are not exploited at the output of the memory 66 (FIG. 6) in the above-described method.

The values of the indices of concurrence $\Delta M_0$ to $\Delta M_{2^\nu - 1}$ are then transmitted to the $2^\nu$ to 1 multiplexer 68.

It is clear that the method, of the invention can also be applied to the systematic, pseudo-systematic or separable codes. Indeed, the reliability of the binary decision may be assigned to the symbols X and Y reconstructed by the same combinational operations as those performed during the coding.

In this case, referring to FIG. 4, the condition of revision of the contents of the register 44 relate no longer to the comparison of the bits $a_k$, represented by $s_k$, of the two concurrent paths 48 and 49 in the second trellis 41 but to the comparison of the bits $X_k$ or $Y_k$ reconstituted at each level k.

The method of the invention is almost optimal, the term "optimal" herein designating a weighting algorithm which delivers, at the output of the decoder, decisions with weighting values that follow a Gaussian relationship of distribution.

Indeed, an identical binary error rate is obtained at output of a circuit of two decoders, the first one of which implements an optimal weighting algorithm, and at output of a single decoder, identical to the second decoder of the preceding circuit, taking its samples from a Gaussian channel, the binary error rate of which is equal to the binary error rate observed at output of the first decoder of the circuit.

Figure 10:
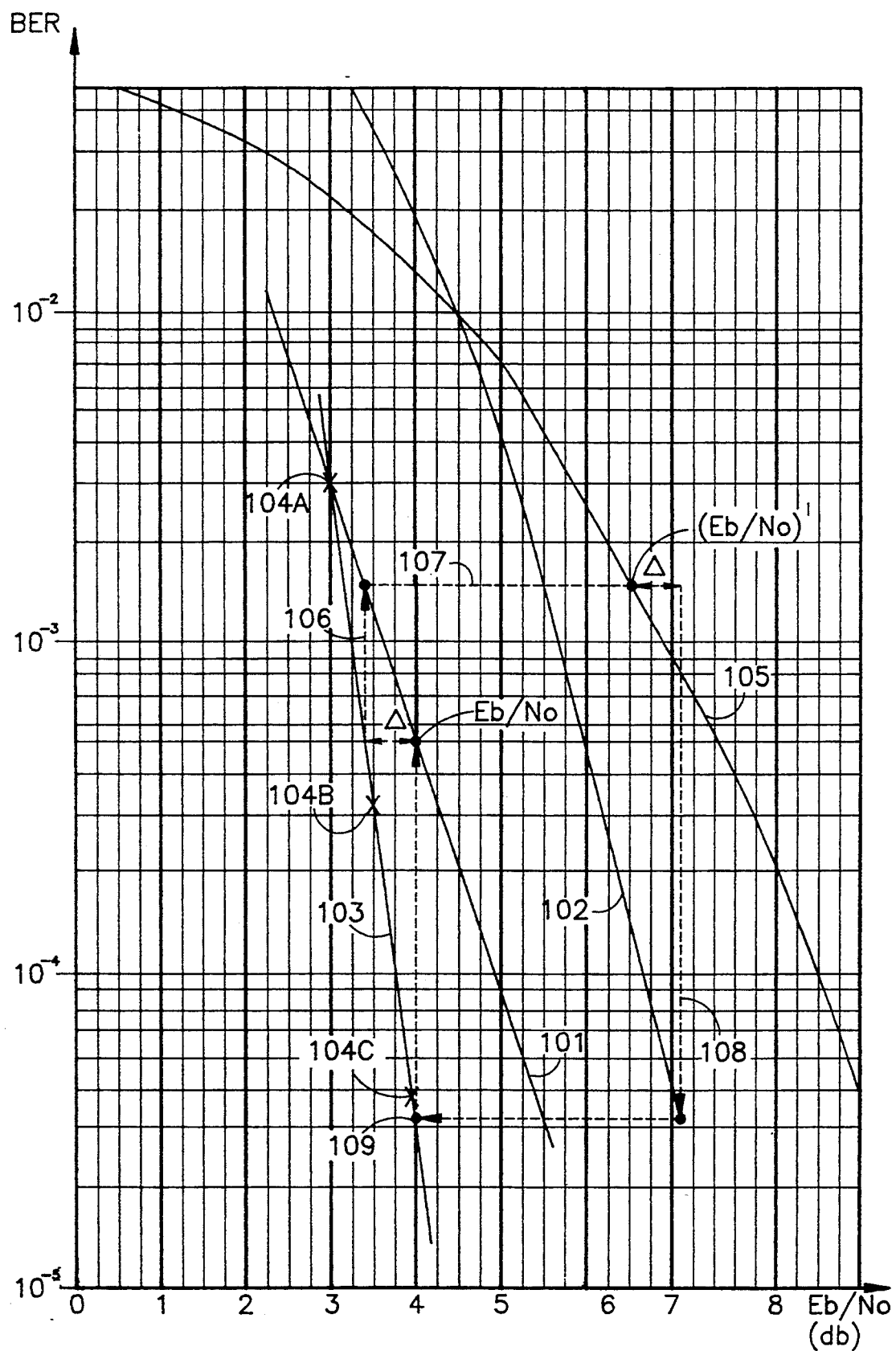
FIG. 10 shows a series of curves illustrating the performance characteristics of the method of the invention, in the case of a code with a constraint length 4 and efficiency rate 4/7 concatenated with a code having a constraint length 2 and efficiency rate ⅔, the two decoders working in fine decision mode.

FIG. 10 illustrates the performance characteristics of the invention in the case of a concatenation of a code with a constraint length 4 and efficiency rate 4/7, the error rate characteristic of which is given by the curve 101, the decoder working in fine decision mode, and a code with a constraint length 2 and an efficiency rate ⅞. The curve 102 is the error rate characteristic of this second code, and the decoder also works in fine decision mode.

At a given signal-to-noise ratio $E_b/N_0$, $E_b$ being the energy received per useful bit and $N_0$ being the monolateral spectral density of noise, a plotting (106) is made of the error rate given by the curve 101 at the abscissa $E_b/N_0 - \Delta$, where $\Delta = 10.\log_{10}(8/7)$.

To this error rate there corresponds (107), on the curve 105 (non-coded transmission), a signal-to-noise ratio $(E_b/N_0)$, to which $\Delta = 10.\log_{10}(8/7)$ is added in order to obtain the signal-to-noise ratio for which the curve 102 gives (108) the error rate sought. Thus, the point 109 of the theoretical curve 103 is obtained.

The crosses $104_A$, $104_B$ and $104_C$ represent the results obtained by the simulation of a decoder using the decoding method of the invention. The difference between these results and the optimal curve 103 cannot be measured. The method of the invention is, therefore, at the very least, almost optimal.

In terms of circuitry, this decoding method represents a complexity that is about twice that of a binary decision Viterbi decoder, when $L' = L/2$. It can therefore easily be implanted on silicon.

Furthermore, owing to the serial, and possibly pipeline, structure of the complete decoder shown in FIGS. 4 and 6, the weighting and revision steps do not penalize the decision step according to the Viterbi algorithm as far as data-processing speed is concerned.

What is claimed is:

1. A method for maximum likelihood decoding of a digital signal transmitted in the presence of noise using reduced storage and processing means providing for improved weighting, the method comprising the steps of receiving at a receiver a sequence of received samples R(t) corresponding to a convolutional coding of a source digital elements a(t) of a signal transmitted in the presence of noise, estimating an estimation value s(t) of each of said source digital elements a(t) taking account of a first series of L received samples, including said received sample R(t) corresponding to said source digital element a(t) and the following L−1 received samples R(t+1), ... , R(t+L−1), L being an integer strictly greater than 1, computing a weighting coefficient m(t) representing reliability of said estimation value s(t), taking account of a second series of N received samples, comprising said received sample R(t) corresponding to said source digital element a(t) and the following N−1 received samples R(t+1), ... , R(t+L−1), ... , R(t+N−1), N being an integer strictly greater than L, and associating with each of said received Sample R(t) said estimation value s(t) along with said weighting coefficient m(t) to identify at the receiver the most likely coding of the source digital elements a (t).

2. A method according to claim 1, further comprising a step of revising, at each instant of reception t, each of the weighting coefficients m(t−N) to m(t−L−1), corresponding to the N−L last estimation values s(t−N) to s(t−L−1), as a function of the received sample R(t).

3. A method according to claim 2, comprising the step of using a decision algorithm of the Viterbi algorithm type to arrive at the estimation value s(t), said decision algorithm defining a first trellis $T(2^\nu, L)$ of the possible states of the coding, including a set of nodes, organized in L depth levels, of $2^\nu$ nodes, L being the number of received samples R(t−L−1), ... , R(t) taken into account for the estimation value s(t), and $2^\nu$ being the number of possible states of the convolutional code at a given instant, $\nu$ being the constraint length of the code used for the coding, each of said nodes of a given depth level i corresponding to a given instant of reception and being connected to two nodes of the preceding depth level i−1, corresponding to the preceding instant of reception, by means of two paths, each path corresponding to a possible transition according to said convolutional code, wherein said estimating step comprises the steps of:

determining, for each node of said first trellis, two cumulated distances $M^0$ and $M^1$ respectively corresponding to each of said two paths corresponding to a possible transition;

selecting, for each node of said first trellis, the path having the smaller of the cumulated distances $M^0$ and $M^1$, called the survivor path;

eliminating, from said first trellis, the path having the greater of the cumulated distances $M^0$ and $M^1$, called the concurrent path;

tracing back in said first trellis, starting from the node having the smallest cumulated distance on the first depth level, corresponding to the last received sample R(t), following, at each level, the survivor path associated with the node reached; thereby defining the optimal path; and associating, with the estimation value s(t−L) corresponding to the decoding of the received sample R(t−n), the value of a terminal node of said optimal path;

wherein said computing step comprises a step of associating, with estimation value s(t−L), a weighting coefficient m(t−L), representing the reliability of said estimation value s(t−L), said weighting coefficient being obtained by analyzing the cumulated distances $M^0$ and $M^1$ associated with each of the nodes of said optimal path;

and wherein said step of revising, at each instant of reception t, said weighting coefficients comprises the steps of:

storing the weighting coefficient m(t−L) associated with said estimation S(t−L);

defining a second trellis $T'(2^\nu, L')$ of the possible states of the coding, where $L' = N−L$, consecutive to said first trellis $T(2^\nu, L)$, corresponding to the instants of reception between t−L−1 and t−L−L';

tracing back, in said second trellis, the two concurrent paths corresponding to the two paths coming from said terminal node of the optimal path of the first trellis to obtain two values $s^k$ and $s'^k$ respectively corresponding to the digital samples received on the two concurrent paths.; and resetting the values of each of the weighting coefficients re(t−L−1) to re(t−N) associated respectively with each of the estimations s(t−L−1) to s(t−N) of the values of the digital samples received between the instants t−L−1 and t−N as a function of a level-to-level comparison of the values $s_k$ and $s'_k$.

4. A method according to claim 3, wherein the depth L' of said second trellis is substantially equal to half the depth L of said first trellis.

5. A method according to claim 3, further comprising the steps of associating a provisional weighting coefficient m(t) with each of said nodes of said first trellis, and updating each of said provisional weighting coefficients m(t) at each instant of reception t as a function of the received sample R(t).

6. A method according to claim 3, wherein said weighting coefficient m(t−L), determined during said computing step, is equal to the absolute value $\Delta M_{t-L}$ of the difference between the two metrics $M^0_{t-L}$ and $M^1_{t-L}$ associated with said terminal node of said optimal path, also called a concurrence index, said metrics $M^0_{t-L}$ and $M^1_{t-L}$ being, respectively, the total of the distances $L^0$ and $L^1$ computed for each node of said optimal path, said distances $L^0$ and $L^1$ representing the difference between the received symbol and the symbols corresponding to one of the two transitions possible in order to reach each node.

7. A method according to claim 6, wherein said resetting step comprises a step of logarithmically compressing said concurrence index $\Delta M_{t-L}$, thus forming a logarithmically compressed concurrence index equal to the weighting coefficient $m_{t-L}$, before said storing step.

8. A method according to claim 6 wherein, at each reception instant t and for each of the levels k of said second trellis, said reseting step comprises the steps of comparing the values $s_k$ and $s'_k$ corresponding to the received sample R(t−L−k) on each of the two concurrent paths, and reducing said concurrence index $\Delta M_k$ downwards if these values $s_k$ and $s'_k$ are different.

9. A method according to claim 8 wherein said reseting set comprises the step of equating, when said values $s_k$ and $s'_k$ corresponding to the sample received R(t−L−k) on each of the two concurrent paths are different, said concurrence index $\Delta M_k$ to the smaller of the values $\Delta M_k$ and $\Delta M_L$, $\Delta M_L$ being the concurrence index associated with the estimation value s(t−L), at the starting point of said concurrent paths, determined during said weighting step.

10. A method according to claim 9, further comprising the step of recomputing said concurrence index $\Delta M_L$, at each instant of reception t, as a function of the received samples R(t−L) to R(t).

11. A method according to any of the claims 1 to 4, wherein the received samples R(t) comprise, at least at certain instants t, two distinct coded data elements X(t) and Y(t) corresponding to said source digital element a(t).

12. A decoder of a sequence of received samples R(t), corresponding to a convolutional coding of a sequence of source digital elements a(t), said decoder comprising:
first and second storing means operating as level-by-level shift registers;
said first storing means being designed for storing a first trellis $T(2^\nu, L)$ of the possible states of the coding, comprising a set of nodes, organized in L depth levels of $2^\nu$ nodes, L being an integer strictly greater than 1, and
said second storing means being designed for storing a second trellis $T'(2^\nu, L')$ of the possible states of the coding, comprising a set of nodes, organized in L' depth levels, of $2^\nu$ nodes, L' being an integer strictly greater than 1,
said second storing means being connected consecutively to said first means for storing, so that said first storing means stores data corresponding to instants of reception between t and t−L and said second storing means stores data corresponding to instants of reception between t−L−1 and t−L−L';
means for tracing back of an optimal path ending with a final node, in said first trellis stored in said first means storing;
means for tracing back of two concurrent paths in said second trellis stored in said second means storing;
means for computing concurrence indices for each node of said first trellis;
third storing means of all concurrence indices associated with each node of said first trellis, with a size $L \times 2^\nu \times \mu$, where $\mu$ is the number of bits used for the coding of each concurrence index;
a shift register, for storing weighting coefficients m(t−L−1) to m(t−N); and
means for revision of said weighting coefficients, as a function of said two concurrent paths traced back to said second trellis.

13. A decoder according to claim 12 wherein said shift register for storing the weighting coefficients is supplied by the concurrence index $\Delta M_{t-L}$ of said final node of said optimal path, converted according to a logarithmic relationship to form $m_{t-L}$.

* * * * *

UNITED STATES PATENT AND TRADEMARK OFFICE
CERTIFICATE OF CORRECTION

PATENT NO. : 5,406,570
DATED : April 11, 1995
INVENTOR(S) : Claude Berrou and Patrick Adde It is certified that error appears in the above-identified patent and that said Letters Patent is hereby corrected as shown below:

At column 12, line 37, please delete "R(t-n)" and insert therefor --R(t-L)--;

At column 12, line 50, please delete "S(t-L)" and insert therefor --s(t-L)--;

At column 12, line 63, please delete "re(t-L-1) to re(t-N)" and insert therefor --m(t-L-1) to m(t-N)--;

At column 13, line 47, please delete "1 to 4" and insert therefor --1 to 10--;

At column 14, line 20, please delete "means for storing" and insert therefor --storing means--; and At column 14, line 28, please delete "means storing" and insert therefor --storing means--.

Signed and Sealed this

Twelfth Day of September, 1995

Attest:

BRUCE LEHMAN

*Attesting Officer*   *Commissioner of Patents and Trademarks*